(12) United States Patent
Kuriyama

(10) Patent No.: US 7,088,183 B2
(45) Date of Patent: Aug. 8, 2006

(54) BIAS CIRCUIT

(75) Inventor: Yasuhiko Kuriyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 10/883,745

(22) Filed: Jul. 6, 2004

(65) Prior Publication Data

US 2005/0062541 A1    Mar. 24, 2005

(30) Foreign Application Priority Data

Sep. 22, 2003  (JP)  ............... 2003-329998

(51) Int. Cl.
*H03F 3/04* (2006.01)
(52) U.S. Cl. ..................................... 330/296
(58) Field of Classification Search .............. 330/285, 330/296
See application file for complete search history.

(56) References Cited

U.S. PATENT DOCUMENTS 5,629,648 A     5/1997  Pratt .......................... 330/289
6,300,837 B1 *  10/2001 Sowlati et al. .............. 330/296
6,333,677 B1    12/2001 Dening ....................... 330/296
6,492,769 B1    12/2002 Oda et al. .................... 330/133
6,549,076 B1     4/2003 Kuriyama ................... 330/296
6,566,954 B1     5/2003 Miyazawa .................. 330/285
6,624,700 B1 *   9/2003 Luo et al. .................... 330/281

FOREIGN PATENT DOCUMENTS

JP           2003-58262      2/2003

* cited by examiner

*Primary Examiner*—Steven J. Mottola
(74) *Attorney, Agent, or Firm*—Oblon, Spivak, McClelland, Maier & Neustadt, P.C.

(57) ABSTRACT

A bias circuit supplying a bias current to a first transistor includes a second transistor having a collector connected to a first power supply and having an emitter connected to a base of the first transistor, a third transistor having a collector connected to the emitter of the second transistor and having an emitter connected to a second power supply, a voltage supply circuit supplying a base voltage to a base of the second transistor, a first resistor connecting the collector of the third transistor and a base thereof, and a capacitor connected between the base of the second transistor and the second power supply.

9 Claims, 3 Drawing Sheets

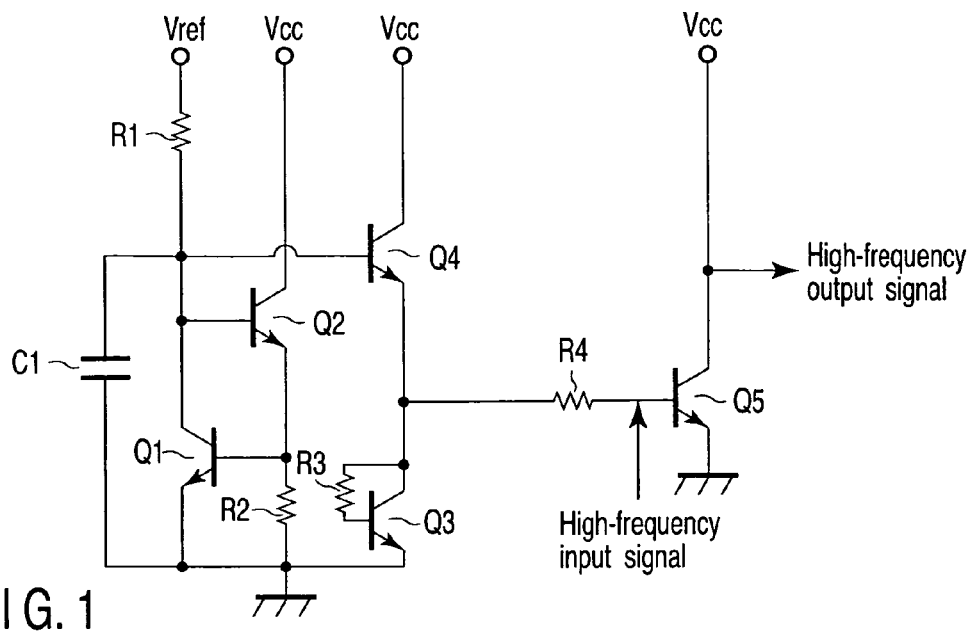
F I G. 1
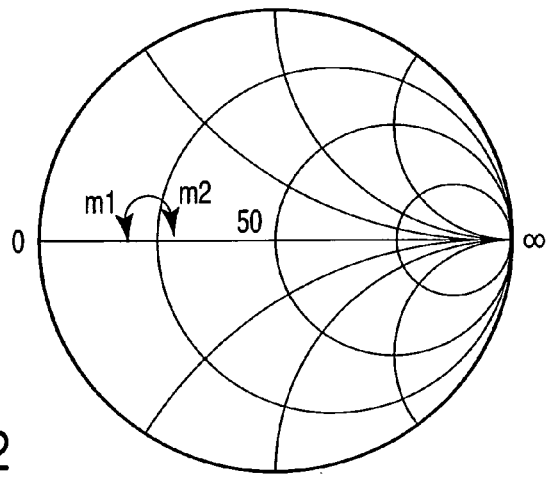
F I G. 2
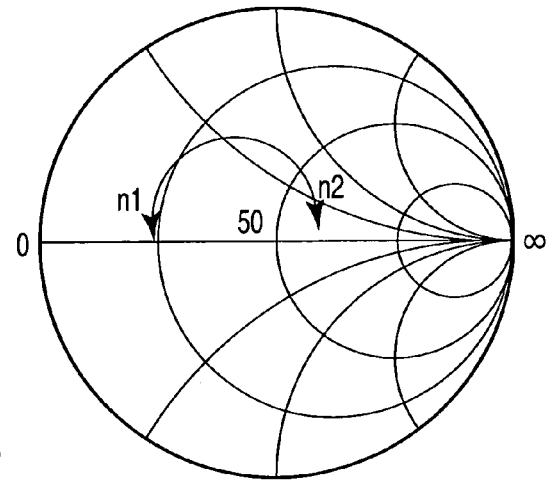
F I G. 3

BIAS CIRCUIT

CROSS-REFERENCE TO RELATED APPLICATIONS

This application is based upon and claims the benefit of priority from prior Japanese Patent Application No. 2003-329998, filed Sep. 22, 2003, the entire contents of which are incorporated herein by reference.

BACKGROUND OF THE INVENTION

1. Field of the Invention

This invention relates to a high-frequency amplification circuit amplifying a high-frequency signal and, more particularly, a bias circuit supplying a bias current to a high-frequency amplification transistor.

2. Description of the Related Art

In a high-power amplifier using a bipolar transistor, as a collector current is greatly influenced by the variation in temperature, a bias current of the high-power amplifier is supplied by, for example, a current mirror circuit in which transistors are diode-connected. On the other hand, an amplifier which is linear and highly efficient at an output level of a wide dynamic range, is implemented by setting the bias condition to the B class (a scheme of supplying the bias current until the collector current stops flowing when the input of the high-power amplifier is zero) and reducing the bias current. Actually, however, as distortion caused by variation in gain becomes great due to non-linearity of an element, linearity of gain is maintained at the output level of the wide dynamic range in a manner such as the AB class that allows the bias current to flow to some extent.

In an AB-class amplifier using a bipolar transistor, as the collector current increases in accordance with the output level, the bias circuit must also sufficiently supply an increased amount of the base current in accordance with the increase in the collector current. For this reason, to lower output impedance of the bias circuit, a bias circuit composed of a current mirror circuit supplying the base current via an emitter follower or the like is used.

FIG. 6 shows an example of the bias circuit using an emitter follower. A power supply voltage Vcc is supplied to a collector of a transistor Q8. A reference voltage Vref is supplied to a base of the transistor Q8 through a resistor R6. An emitter of the transistor Q8 is connected to a ground potential through a resistor R7. Diode-connected transistors Q6 and Q7 are connected in series between the base of the transistor Q8 and the ground potential.

In a high-frequency amplification circuit using such a bias circuit, however, the transistors are stacked at two stages. Thus, it is impossible to sufficiently compensate for the variation in the bias current to the influence of the variation in temperature unless the reference voltage Vref is increased to be much higher than the double of an ON-state voltage of the transistors. On the other hand, the increase in the reference voltage Vref is a serious problem in a system such as a cellular phone having a low control voltage. Especially, in a system which must be operated linearly with the output level of a wide dynamic range such as the CDMA (Code Division Multiple Access), the variation in an idle current caused by the influence of the variation in temperature at the low-power output time becomes a problem.

FIGS. 7 and 8 show another example of the bias circuit. The bias circuit shown in FIG. 7 is configured such that a transistor Q10 is turned on at one stage through a resistor R8. The bias circuit shown in FIG. 8 is configured such that transistors Q11 and Q12 are added in order to compensate for the temperature of the transistor Q8.

However, as the output impedance of these bias circuits is low, the high-frequency signal leaks to the bias circuits. In addition, a bias point is moved due to the influence of the high-frequency signal leaking to the bias circuit. For this reason, a choke inductor L1 to block the high-frequency signal and a capacitor C2 for decoupling need to be provided between the bias circuit and the transistor Q10 serving as a high-frequency amplifier, as shown in FIGS. 7 and 8. As the inductor L1 has a large circuit scale and the capacitor C2 needs to have a large capacitance, the bias circuit can hardly be downsized.

Various bias circuits stabilizing the bias supply amount have been disclosed as this kind of the related technique (see Jpn. Pat. Appln. KOKAI Publication No. 2003-58262).

BRIEF SUMMARY OF THE INVENTION

According to a first aspect of the present invention, there is provided a bias circuit supplying a bias current to a first transistor. The bias circuit comprises a second transistor having a collector connected to a first power supply and having an emitter connected to a base of the first transistor, a third transistor having a collector connected to the emitter of the second transistor and having an emitter connected to a second power supply, a voltage supply circuit supplying a base voltage to a base of the second transistor, a first resistor connecting the collector of the third transistor and a base thereof, and a capacitor connected between the base of the second transistor and the second power supply.

According to a second aspect of the present invention, there is provided a bias circuit supplying a bias current to a first transistor. The bias circuit comprises a second transistor having a collector connected to a first power supply and having an emitter connected to a base of the first transistor, a voltage supply circuit supplying a base voltage to a base of the second transistor, a first resistor connected between the emitter of the second transistor and a second power supply, and a capacitor connected between the base of the second transistor and the second power supply.

BRIEF DESCRIPTION OF THE SEVERAL VIEWS OF THE DRAWING

FIG. 1 shows a circuit configuration of a bias circuit according to a first embodiment of the present invention;

FIG. 2 shows a Smith chart illustrating an impedance of a conventional bias circuit;

FIG. 3 shows a Smith chart illustrating an impedance of the bias circuit shown in FIG. 1;

DETAILED DESCRIPTION OF THE INVENTION

Figure 4:
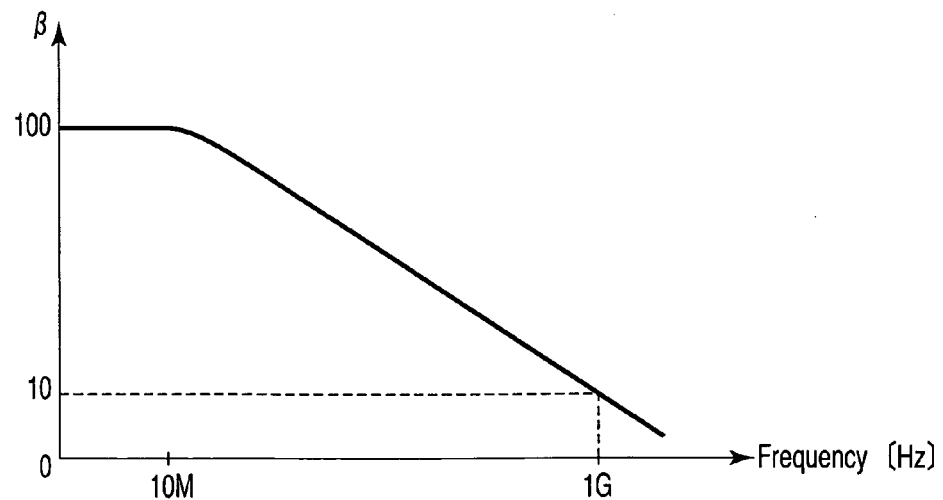
FIG. 4 shows a graph illustrating a relationship between a beta and a frequency of a transistor.

Embodiments of the present invention will be described below with reference to the attached drawings. Constituent elements having the same functions and structures are denoted by the same reference numerals, and their explanations are repeated if necessary.

FIRST EMBODIMENT

FIG. 1 shows a circuit configuration of a bias circuit according to a first embodiment of the present invention.

A transistor Q5 amplifies, for example, a high-frequency input signal and outputs it as a high-frequency output signal. The transistor Q5 is composed of, for example, a common-emitter circuit. A power supply voltage Vcc is supplied to a collector of the transistor Q5. A ground potential is supplied to an emitter of the transistor Q5. The high-frequency input signal to be amplified is input to a base of the transistor Q5. The high-frequency input signal is amplified and output from an output terminal connected to the collector of the transistor Q5. A bias current is also supplied to the base of the transistor Q5.

A bias circuit supplying the bias current to the transistor Q5 is formed as explained below. A transistor Q4 supplying the bias current is composed of a common-collector circuit (emitter follower). The power supply voltage Vcc is supplied to a collector of the transistor Q4. A base voltage is supplied to a base of the transistor Q4.

A voltage supply circuit supplying the base voltage is composed of transistors Q1, Q2 and resistors R1, R2. One of terminals of the resistor R1 is connected to the base of the transistor Q4. A reference voltage Vref is supplied to the other terminal of the resistor R1. The reference voltage Vref is determined in accordance with a base-emitter voltage that is a characteristic of the transistor, and the like. A base of the transistor Q2 is connected to the other terminal of the resistor R1. The power supply voltage Vcc is supplied to a collector of the transistor Q2. The ground potential is supplied to an emitter of the transistor Q2 through the resistor R2.

A collector of the transistor Q1 is also connected to the base of the transistor Q2. The emitter of the transistor Q2 is connected to a base of the transistor Q1. The ground potential is supplied to an emitter of the transistor Q1. The voltage supply circuit is thus composed. The above-explained voltage supply circuit is a mere example and is not limited thereto. The voltage supply circuit may have the other configurations.

Incidentally, a collector of a transistor Q3 is connected to an emitter of the transistor Q4. In the transistor Q3, a collector and a base are connected through a resistor R3. The ground potential is supplied to an emitter of the transistor Q3.

In addition, a capacitor C1 is connected between the base of the transistor Q4 and the ground potential. A resistor R4 is connected between the emitter of the transistor Q4 and the base of the transistor Q5.

Next, a structure of each of the elements is explained. As for each of the transistors used in this embodiment, an InGaP/GaAs HBT (Hetero-junction Bipolar Transistor) having an emitter formed of InGaP and a base formed of GaAs is used. The transistor Q5 has a multi-emitter structure which includes forty-eight emitters, and each have a size of $4\times30$ μm$^2$. In the bias circuit, the emitter size of the transistors Q1 and Q2 is $4\times10$ μm$^2$, and the emitter size of the transistor Q3 is $4\times20$ μm$^2$. The transistor Q4 has a multi-emitter structure which includes forty-eight emitters, and each have a size of $4\times30$ μm$^2$. The resistor R1 has a resistance of 600 Ω. The resistor R2 has a resistance of 3000 Ω. The resistor R3 has a resistance of 1000 Ω. The capacitor C1 has 2pF. These numerical values are mere examples, and the elements are not limited to these examples.

The elements forming the bias circuit and the transistor Q5 serving as the high-frequency amplifier are formed by a MMIC (Monolithic Microwave Integrated Circuit) that forms the elements on the same semiconductor substrate.

Next, operations of the bias circuit thus formed are explained.

The base voltage is supplied to the base of the transistor Q4 by the voltage supply circuit. The base voltage is generated on the basis of the base-emitter junction voltage of the transistors Q1 and Q2. Thus, the base voltage which does not depend on the variation of the power supply voltage Vcc can be supplied. It is possible to compensate for the temperature of the transistor Q4 by the transistors Q1 and Q2.

Next, operations of the bias circuit in a case where the high-frequency signal is input to the bias circuit are explained. When the high-frequency input signal is input to the base of the transistor Q5, the high-frequency signal leaks to the bias circuit as the output impedance of the bias circuit is low. However, the high-frequency signal leaking to the transistor Q3 side is blocked by the resistor R3. The principle of the blocking will be explained later. For this reason, movement of the bias point of the transistor Q5 can be prevented by influence of the direct current obtained by rectifying the leaking high-frequency signal by the transistor Q3.

In addition, the high-frequency signal leaking to the transistor Q4 side is absorbed by the capacitor C1. For this reason, the stable base voltage can be supplied to the transistor Q4 by restricting the influence of the high-frequency input signal to the transistors Q1 and Q2.

Figure 8:
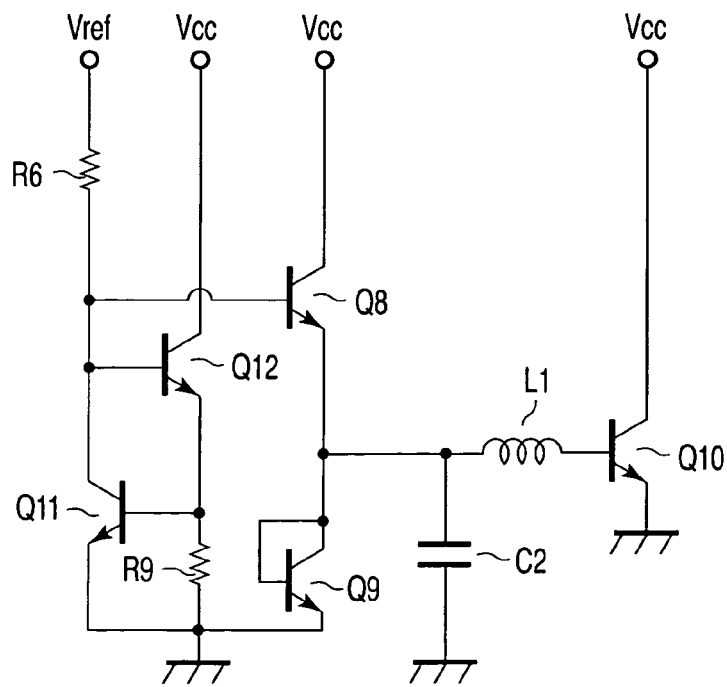
FIG. 8 shows still another example of a bias circuit using an emitter follower.

FIG. 2 shows a Smith chart illustrating the impedance of the bias circuit shown in FIG. 8. FIG. 3 shows a Smith chart illustrating the impedance of the bias circuit shown in FIG. 1. In FIG. 2, m1 represents the impedance in a case where the frequency of the signal which is input to the bias circuit is 1 MHz and m2 represents the impedance in a case where the frequency of the signal which is input to the bias circuit is 2 GHz. Similarly, in FIG. 3, n1 represents the impedance in a case where the frequency of the input signal is 1 MHz and n2 represents the impedance in a case where the frequency of the input signal is 2 GHz.

In FIG. 2, the impedance of m1 is 12 Ω and the impedance of m2 is 18.5 Ω. Thus, the impedance does not become great even if the frequency of the signal is higher. For this reason, in the bias circuit of FIG. 8, the inductor L1 for choke and the capacitor C2 for decoupling are needed if the high-frequency signal is handled.

On the other hand, in FIG. 3, the impedance of n1 is 15 Ω and the impedance of n2 is 76 Ω. Thus, the impedance becomes great if the frequency of the signal is higher. For this reason, in the bias circuit of FIG. 1, the high-frequency signal can be blocked without using an inductor for choke.

This principle brings about effects by taking advantage of the frequency response of the beta (current amplification of the emitter-grounded amplifier) of the transistor. FIG. 4 shows a graph illustrating a relationship between the beta and the frequency. For example, a transistor having the direct current amplification (hfe) of 100 is explained. In FIG. 4, the vertical axis represents the beta (β) and the horizontal axis represents the frequency. In a case of the direct current (frequency is zero), the beta is 100 but starts reducing where the frequency is about 10 MHz. The beta reduces to about 10 where the frequency is about 1 GHz.

The transistor Q3 whose collector and base are connected through the resistor R3 is considered equivalent to a circuit wherein a resistor having a resistance value of R3/β and the transistor Q3 whose collector and base are directly connected are connected in series. Therefore, if the resistor R3 has a resistance of 1000 Ω as explained above, the impedance of the bias circuit in which the direct current is handled seems to be only 10 Ω but the impedance of the bias circuit using the high-frequency signal seems to be equal to or higher than 100 Ω. For this reason, the impedance can be made greater in the bias circuit using the high-frequency signal.

As described above, the present invention of this embodiment comprises the transistor Q4 composed of the emitter follower which supplies the bias current to the transistor Q5 amplifying the high-frequency input signal. The transistor Q3 whose collector and base are diode-connected is connected to the emitter of the transistor Q4. The resistor R3 is inserted between the diode-connected collector and base of the transistor Q3. Furthermore, the capacitor C1 is provided between the base of the transistor Q4 and the ground potential.

Therefore, according to this embodiment, the high-frequency signal leaking to the bias circuit can be blocked. Thus, the influence of the high-frequency signal to the bias circuit can be removed.

In addition, the high-frequency signal can be blocked by using the elements such as the resistors and capacitors whose area is small, instead of the elements such as the inductor and the like whose area is large. Thus, the circuit scale of the bias circuit or the high-frequency amplification circuit can be made smaller. Especially, when the high-frequency amplification circuit is formed on the same substrate as described in this embodiment, the effect of reducing the circuit scale by using no inductors is great.

Moreover, when the capacitor for decoupling is connected to the base of the transistor Q5, the capacity of the capacitor must be made large. However, when the capacitor C1 is connected to the base of the transistor Q4 as described in this embodiment, the capacity of the capacitor is small. This is because the impedance at a position connecting to the capacitor C1 is higher as compared with the position of the base of the transistor Q5. For this reason, as the area of the capacitor can be reduced, the circuit scale of the bias circuit or the high-frequency amplification circuit can be made smaller.

Furthermore, compensation for the temperature of the transistor Q5 can be performed by providing the transistor Q3.

Furthermore, the impedance of the bias circuit can be made higher by inserting the resistor R4 between the emitter of the transistor Q4 and the base of the transistor Q5. For this reason, the high-frequency signal leaking to the bias circuit can be restricted.

SECOND EMBODIMENT

Figure 5:
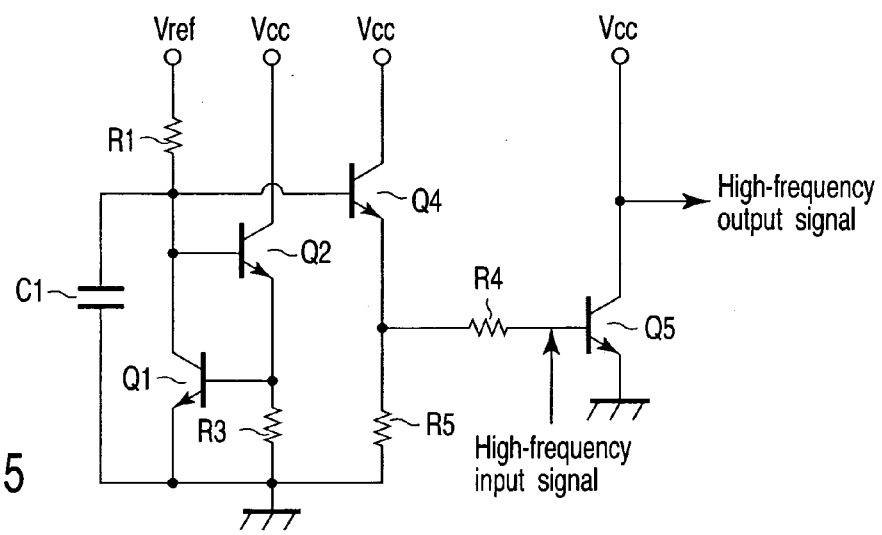
FIG. 5 shows a circuit configuration of a bias circuit according to a second embodiment of the present invention.

FIG. 5 shows a circuit configuration of a bias circuit according to a second embodiment of the present invention.

In FIG. 5, a resistor R5 is connected between the emitter of the transistor Q4 and the ground potential.

An operation of the bias circuit thus formed is explained. If the high-frequency input signal is input to the base of the transistor Q5, the high-frequency signal leaks to the bias circuit as the output impedance of the bias circuit is low. However, the high-frequency signal leaking to the resistor R5 side is blocked by the resistor R5. In addition, as the transistor Q3 is removed, it is possible to prevent the leaking high-frequency signal from being rectified and the direct current from being generated.

The high-frequency signal leaking to the transistor Q4 side is absorbed by the capacitor C1. For this reason, the stable base voltage can be supplied to the transistor Q4 by restricting the influence of the high-frequency signal to the transistors Q1 and Q2.

As described above, in this embodiment, the resistor R5 is provided instead of the transistor Q3 provided in the first embodiment.

Therefore, the high-frequency signal leaking to the bias circuit can be blocked. For this reason, the influence of the high-frequency signal to the bias circuit can be removed.

In this embodiment, the bias circuit of a simpler configuration can be formed as compared with the first embodiment.

In addition, as the circuit elements can be reduced as compared with the first embodiment, the circuit scale can be made smaller.

Figure 6:
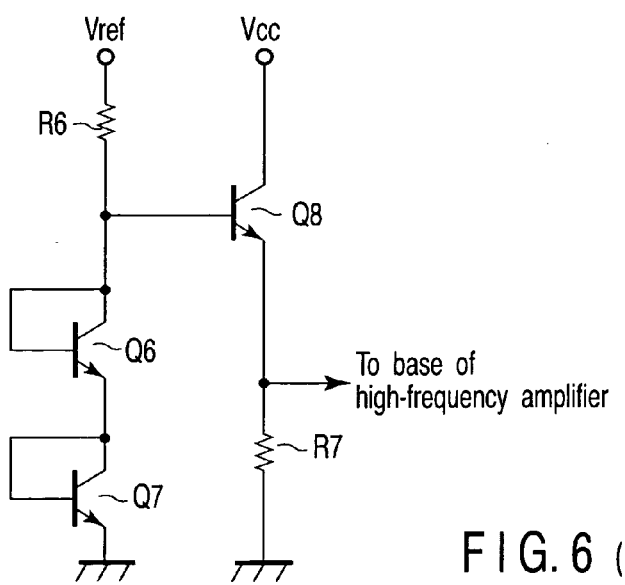
FIG. 6 shows an example of a bias circuit using an emitter follower.
Figure 7:
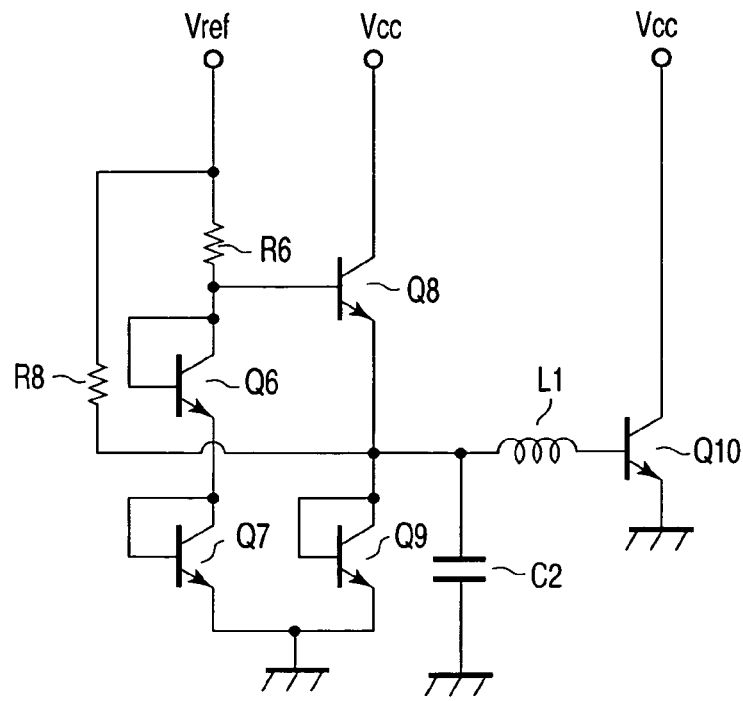
FIG. 7 shows another example of a bias circuit using an emitter follower.

Even if the first and second embodiments are applied to the bias circuit shown in FIGS. 6 and 7, the same advantage can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A bias circuit supplying a bias current to a first transistor, comprising:
    a second transistor having a collector connected to a first power supply and having an emitter connected to a base of the first transistor;
    a third transistor, a collector of the third transistor connected to the emitter of the second transistor, and an emitter of the third transistor connected to a second power supply;
    a voltage supply circuit supplying a base voltage to a base of the second transistor;
    a first resistor connecting the collector of the third transistor and a base of the third transistor; and
    a capacitor connected between the base of the second transistor and the second power supply.

2. The bias circuit according to claim 1, further comprising a second resistor connected between the base of the first transistor and the emitter of the second transistor.

3. The bias circuit according to claim 1, wherein the voltage supply circuit comprises:
    a fourth transistor, a collector of the fourth transistor connected to the first power supply, a base of the fourth transistor connected to a constant-voltage power supply through a third resistor, and an emitter of the fourth transistor connected to the second power supply through a fourth resistor; and
    a fifth transistor, a collector of the fifth transistor connected to the base of the fourth transistor, a base of the fifth transistor connected to the collector of the fourth transistor, and an emitter of the fifth transistor connected to the second power supply.

4. The bias circuit according to claim 1, wherein the second power supply supplies a ground potential.

5. The bias circuit according to claim 1, wherein the first transistor amplifies a high-frequency signal.

6. A bias circuit supplying a bias current to a first transistor, comprising:

a second transistor having a collector connected to a first power supply and having an emitter connected to a base of the first transistor;
a voltage supply circuit supplying a base voltage to a base of the second transistor;
a first resistor connected between the emitter of the second transistor and a second power supply; and
a capacitor connected between the base of the second transistor and the second power supply,
wherein the voltage supply circuit comprises
a third transistor, a collector of the third transistor connected to the first power supply, a base of the third transistor connected to a constant-voltage power supply through a second resistor, and an emitter of the third transistor connected to the second power supply through a third resistor; and a fourth transistor, a collector of the fourth transistor connected to the base of the third transistor, a base of the fourth transistor connected to the collector of the third transistor, and an emitter of the fourth transistor connected to the second power supply.

7. The bias circuit according to claim 6, further comprising a fourth resistor connected between the base of the first transistor and the emitter of the second transistor.

8. The bias circuit according to claim 6, wherein the second power supply supplies a ground potential.

9. The bias circuit according to claim 6, wherein the first transistor amplifies a high-frequency signal.

* * * * *